United States Patent
Xu

(10) Patent No.: US 9,711,625 B2
(45) Date of Patent: Jul. 18, 2017

(54) METHOD FOR MANUFACTURING THIN-FILM TRANSISTOR

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 101 days.

(21) Appl. No.: 14/436,225

(22) PCT Filed: Dec. 9, 2014

(86) PCT No.: PCT/CN2014/093398
§ 371 (c)(1),
(2) Date: Apr. 16, 2015

(87) PCT Pub. No.: WO2016/078169
PCT Pub. Date: May 26, 2016

(65) Prior Publication Data
US 2016/0343834 A1 Nov. 24, 2016

(30) Foreign Application Priority Data
Nov. 20, 2014 (CN) .......................... 2014 1 0667651

(51) Int. Cl.
*H01L 21/335* (2006.01)
*H01L 21/8232* (2006.01)
(Continued)

(52) U.S. Cl.
CPC ...... *H01L 29/66969* (2013.01); *H01L 21/467* (2013.01); *H01L 21/47573* (2013.01); *H01L 27/1225* (2013.01); *H01L 27/1259* (2013.01); *H01L 29/42384* (2013.01); *H01L 29/518* (2013.01)

(58) Field of Classification Search
CPC ....... H01L 27/12; H01L 29/786; H01L 21/00; H01L 27/1225; H01L 27/1288; H01L 29/7869; G02F 1/136213; G02F 1/1368
See application file for complete search history.

(56) References Cited

U.S. PATENT DOCUMENTS

2016/0233250 A1* 8/2016 Yan .................... H01L 29/66969

* cited by examiner

Primary Examiner — Charles Garber
Assistant Examiner — Abdulfattah Mustapha
(74) Attorney, Agent, or Firm — Andrew C. Cheng

(57) ABSTRACT

A method for manufacturing a thin-film transistor includes: forming a first metal layer of a pattern including a gate on a substrate through pattern formation operations; forming a gate insulation layer on the substrate and the first metal layer and forming an oxide semiconductor layer, of which an orthogonal projection is cast on the gate, on the gate insulation layer within a thin-film transistor area and an etch stop layer on the oxide semiconductor layer, in which two etching operations are applied to the patternized oxide semiconductor layer and etch stop layer; forming a patternized second metal layer on the thin-film transistor area and an exposed portion of the gate insulation layer, forming a patternized insulation protection layer on the substrate and the patternized second metal layer, and forming a patternized pixel electrode on the insulation protection layer.

10 Claims, 5 Drawing Sheets

(51) Int. Cl.
  *H01L 29/66* (2006.01)
  *H01L 29/423* (2006.01)
  *H01L 27/12* (2006.01)
  *H01L 29/51* (2006.01)
  *H01L 21/4757* (2006.01)
  *H01L 21/467* (2006.01)

METHOD FOR MANUFACTURING THIN-FILM TRANSISTOR

CROSS REFERENCE TO RELATED APPLICATIONS

This application claims the priority of Chinese Patent Application No. 201410667651.6, entitled "Method for Manufacturing Thin-Film Transistor", filed on Nov. 20, 2014, the disclosure of which is incorporated herein by reference in its entirety.

BACKGROUND OF THE INVENTION

1. Field of the Invention

The present invention relates to the field of manufacture of thin-film transistors, and in particular to a method for manufacturing a thin-film transistor.

2. The Related Arts

Oxide thin-film transistors, which are now in wide use, use an oxide semiconductor as an active layer, which has the advantages of high mobility, high ON-state current, better switching characteristics, and better consistency and is fit for applications requiring a fast response and a large current, such as display devices of high frequency, high definition, and large size and organic light-emitting displays. A manufacturing process of an oxide thin-film transistor backplane that is commonly adopted for conventional etch stopper type oxide thin-film transistors often needs six times of masking (exposure) operations, which are respectively applied to form gate lines and gate terminals, an active layer, an etch stop layer, source and drain terminals, a passivation layer, and vias. Researches have proven that the film characteristics and the complicated manufacturing operations of the etch stop layer impose severe influences on the oxide semiconductor and further, the manufacturing of the etch stop layer requires an individual masking operation so that the manufacturing operation is complicated and the manufacturing cost is correspondingly increased.

SUMMARY OF THE INVENTION

The present invention provides a method for manufacturing a thin-film transistor, which enables simplification of the manufacturing process and lowering of cost.

The present invention provides a method for manufacturing a thin-film transistor. The method for manufacturing a thin-film transistor comprises:

providing a substrate;

forming a first metal layer on the substrate and applying pattern formation operation to form the first metal layer into a pattern including a gate;

forming a gate insulation layer on the substrate and the first metal layer in such a way that the gate insulation layer covers a surface of the substrate and the first metal layer;

forming an oxide semiconductor layer, of which an orthogonal projection is cast on the gate, on the gate insulation layer within a thin-film transistor area and an etch stop layer on the oxide semiconductor layer, wherein the oxide semiconductor layer has an edge portion that is exposed outside the etch stop layer, comprising the following sub-steps:

coating an oxide semiconductor coating layer and an etch stop coating layer on the gate insulation layer of the substrate in such a way that the etch stop coating layer is stacked on the oxide semiconductor coating layer; applying pattern formation operations to simultaneously patternize the oxide semiconductor coating layer and the etch stop coating layer so as to form a patternized oxide semiconductor layer and a patternized etch stop layer on the thin-film transistor area of the substrate; and then, applying two etching operations to the patternized oxide semiconductor layer and etch stop layer;

forming a second metal layer on the thin-film transistor area and an exposed portion of the gate insulation layer and patternizing the second metal layer to form a source and a drain of the thin-film transistor, wherein the source and the drain are both connected to the oxide semiconductor layer;

forming an insulation protection layer on the substrate and the patternized second metal layer and patternizing the insulation protection layer; and forming a patternized pixel electrode on the insulation protection layer at a location, which after patternization is distant from the thin-film transistor area, in such a way that the pixel electrode is connected to the drain.

In the above method, the etch stop layer is made of a metal oxide material.

In the above method, the oxide semiconductor layer and the etch stop layer are formed through one time film formation operation.

In the above method, the etch stop layer is formed through a physical vapor deposition based film formation process.

In the above method, the step of "applying two etching operations to the patternized oxide semiconductor layer and etch stop layer" comprises: first applying a wet etching operation to the patternized oxide semiconductor layer and the etch stop layer so as to form the oxide semiconductor layer and the etch stop layer that are of the same size and have orthogonal projections cast on the gate, and then, applying a wet etching operation to an edge portion of the etch stop layer so as to expose an edge portion of the oxide semiconductor layer.

In the above method, the etch stop layer is made of an inorganic insulation material.

In the above method, the etch stop layer is formed through a chemical vapor deposition based film formation process.

In the above method, the step of "applying two etching operations to the patternized oxide semiconductor layer and etch stop layer" comprises: first applying a wet etching operation to the oxide semiconductor layer and the etch stop layer to form the oxide semiconductor layer and the etch stop layer that are of the same size and have orthogonal projections cast on the gate, and then, applying a dry etching operation to an edge portion of the etch stop layer 16 so as to expose an edge portion of the oxide semiconductor layer.

In the above method, the gate insulation layer and the insulation protection layer are made of one of silicon oxide (SiOx), silicon nitride (SiNx), and silicon oxynitride (SiNxOy).

In the above method, the oxide semiconductor layer comprises a material selected from one of zinc oxide (ZnO), indium zinc oxide (InZnO), zinc tin oxide (ZnSnO), gallium indium zinc oxide (GaInZnO), and zirconium indium zinc oxide (ZrInZnO).

The present invention provides a method for manufacturing a thin-film transistor, which comprises performing one time patternization simultaneously on an oxide semiconductor layer 15 and an etch stop layer 16 and then performing two etching operations to respectively form the oxide semiconductor layer 15 and the etch stop layer 16 that are located exactly above a gate, whereby, compared to the prior art techniques, one time of pattern formation operation can be saved so as to simplify the processing operation of an oxide thin-film transistor and reduce the manufacturing cost of the thin-film transistor.

BRIEF DESCRIPTION OF THE DRAWINGS

To more clearly explain the technical solutions proposed in embodiments of the present invention or those of the prior art, a brief description of the drawings that are necessary for describing the embodiments of the present invention or those of the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to technical solutions of the embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
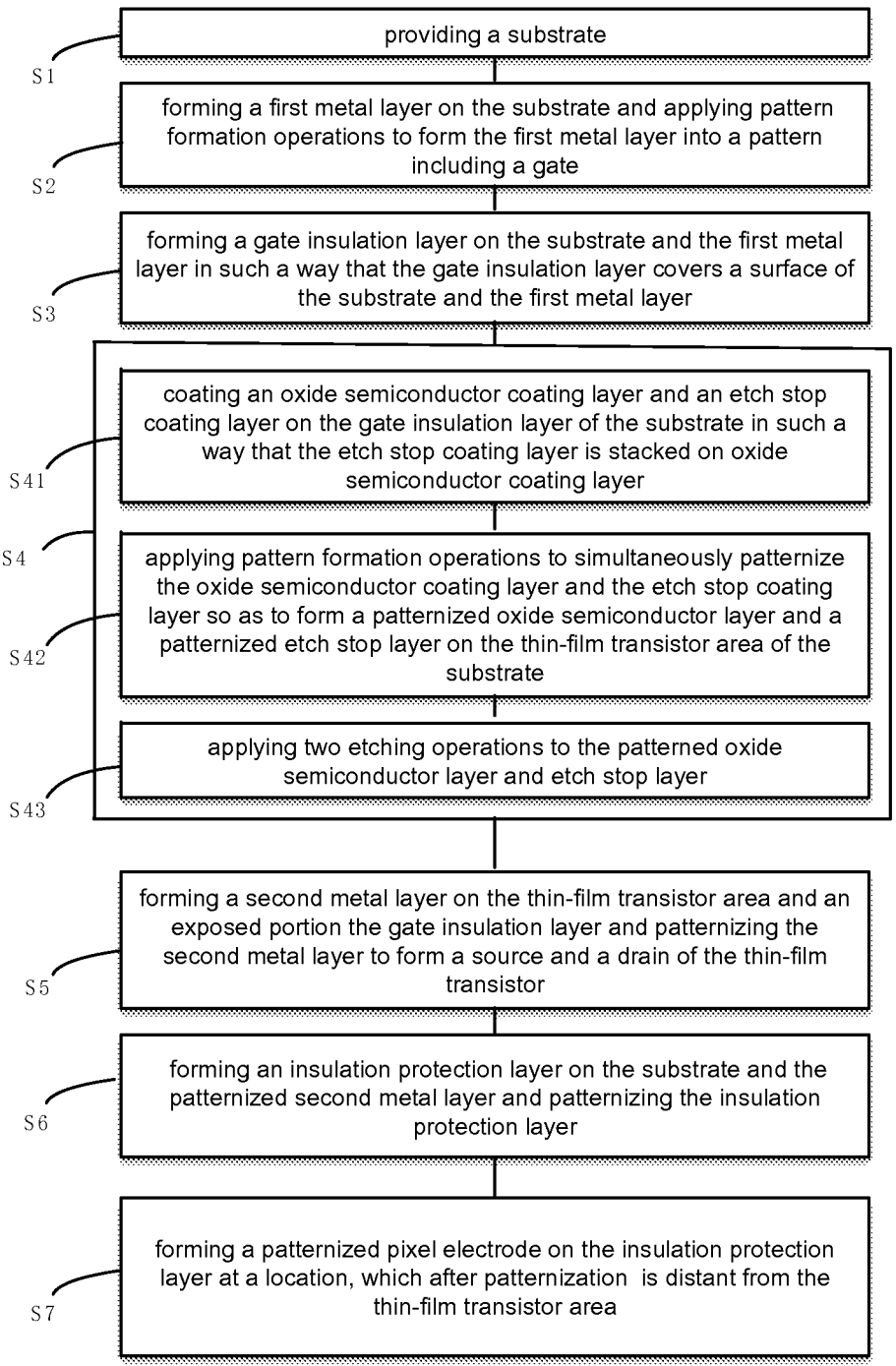
FIG. 1 is a flow chart illustrating a method for a thin-film transistor according to a preferred embodiment of the present invention.

Referring to FIG. 1, a flow chart is shown to illustrate a method for manufacturing a thin-film transistor (TFT) according to a preferred embodiment of the present invention. The method for manufacturing a thin-film transistor comprises the following steps.

Figure 2:
FIGS. 2-8 are cross-sectional views illustrating the thin-film transistor at various manufacturing steps according to the preferred embodiment of the present invention.

Step S1: providing a substrate 10. Referring also to FIG. 2, in the instant embodiment, the substrate 100 is a glass substrate. It is can be appreciated that in other embodiments, the substrate 100 is not limited to a glass substrate.

Figure 3:
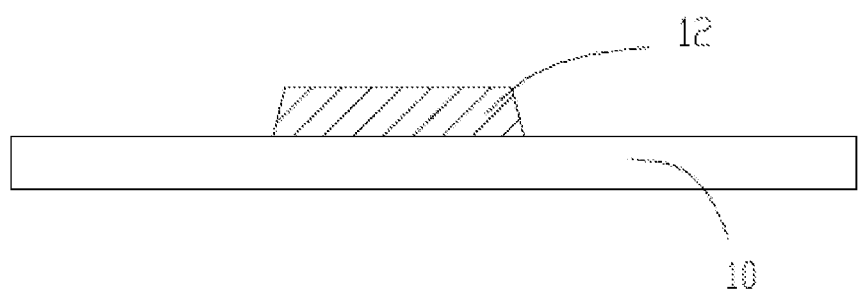

Referring also to FIG. 3, Step S2 is forming a first metal layer 12 on the substrate 10 and applying pattern formation operation to form the first metal layer 12 into a pattern including a gate. Specifically, also referring to FIG. 3, the first metal layer 12 is formed on a surface of the substrate 10 to serve as the gate of the thin-film transistor 10. The first metal layer 12 comprises a material selected from one of copper, tungsten, chromium, aluminum, and combinations thereof. In the instant embodiment, pattern formation operations, such as known operations of photoresist coating, exposure, and development, are applied to patternize the first metal layer 12 to form the gate.

Figure 4:
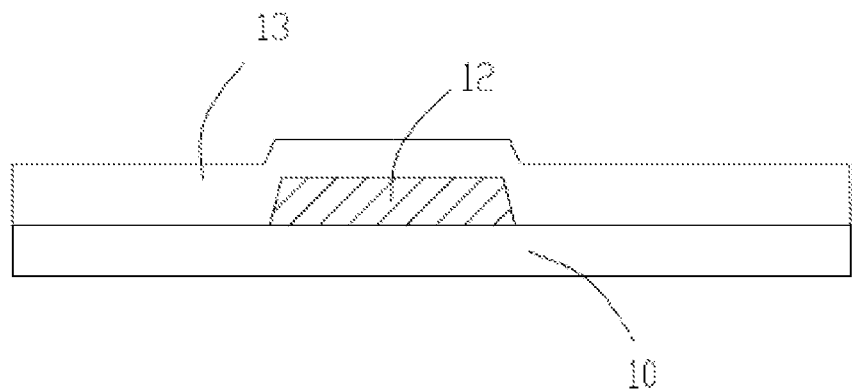

Referring additionally to FIG. 4, Step S3 is forming a gate insulation layer 13 on the substrate 10 and the patternized first metal layer 12 in such a way that the gate insulation layer 13 covers the surface of the substrate 10 and the gate. Specifically, the gate insulation layer 130 is formed on a portion of the surface of the substrate 10 that is not covered by the first metal layer 12 and the first metal layer 12. The gate insulation layer 13 comprises a material selected from one of silicon oxide, silicon nitride layer, silicon oxynitride layer, and combinations thereof.

Figure 5:
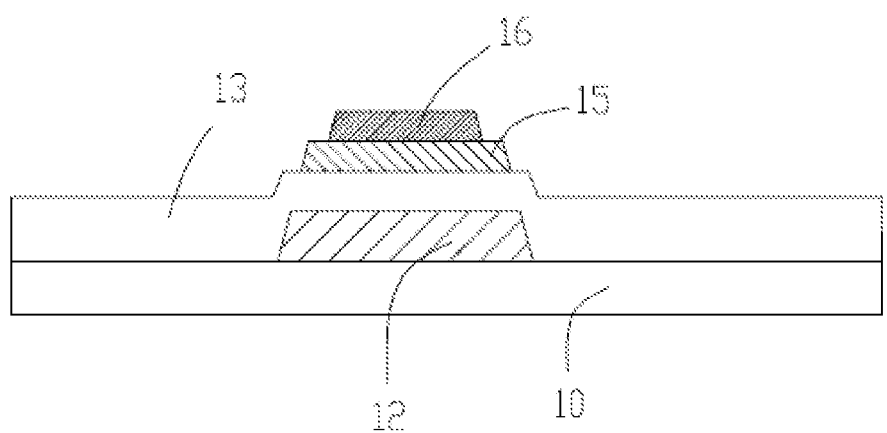

Referring additionally to FIG. 5, Step S4 is forming an oxide semiconductor layer 15, of which an orthogonal projection is cast on the gate, on the gate insulation layer 13 within a thin-film transistor area and an etch stop layer 16 on the oxide semiconductor layer 15. The oxide semiconductor layer 15 has an edge portion that is exposed outside the etch stop layer 16. This step further comprises: Step S41, which forms an oxide semiconductor coating layer and an etch stop coating layer on the gate insulation layer 13 of the substrate 10 in such a way that the etch stop coating layer is stacked on the oxide semiconductor coating layer.

Step S42: applying pattern formation operations to simultaneously patternize the oxide semiconductor coating layer and the etch stop coating layer so as to form a patternized oxide semiconductor layer 15 and a patternized etch stop layer 16 on the thin-film transistor area of the substrate 10.

Step S43: applying two etching operations to the patternized oxide semiconductor layer 15 and etch stop layer 16.

Finally, the oxide semiconductor layer 15 that has an orthogonal projection cast on the gate and the etch stop layer 16 that is located on the oxide semiconductor layer 15 as shown in FIG. 5 are formed, in which an edge portion of the oxide semiconductor layer is exposed outside the etch stop layer. The oxide semiconductor layer comprises a material selected from one of zinc oxide (ZnO), indium zinc oxide (InZnO), zinc tin oxide (ZnSnO), gallium indium zinc oxide (GaInZnO), and zirconium indium zinc oxide (ZrInZnO).

In a first embodiment of the present invention, the etch stop layer 16 is made of a metal oxide material having high oxygen contents, such as indium gallium zinc oxide and the etch stop layer 16 is formed through physical vapor deposition based film formation process. The oxide semiconductor layer 15 and the etch stop layer 16 can be formed through one film formation process so as to reduce the use of film formation operations.

Thus, Step S43, which is the step of "applying two etching operations to the patternized oxide semiconductor layer 15 and etch stop layer 16", further comprises: Step S431, which is applying a wet etching operation to the patternized oxide semiconductor layer 15 and the etch stop layer 16 so as to form the oxide semiconductor layer 15 and the etch stop layer 16 that are of the same size and have orthogonal projections cast on the gate; and Step S432, which is applying a wet etching operation to an edge portion of the etch stop layer 16 so as to expose an edge portion of the oxide semiconductor layer 15.

Figure 6:
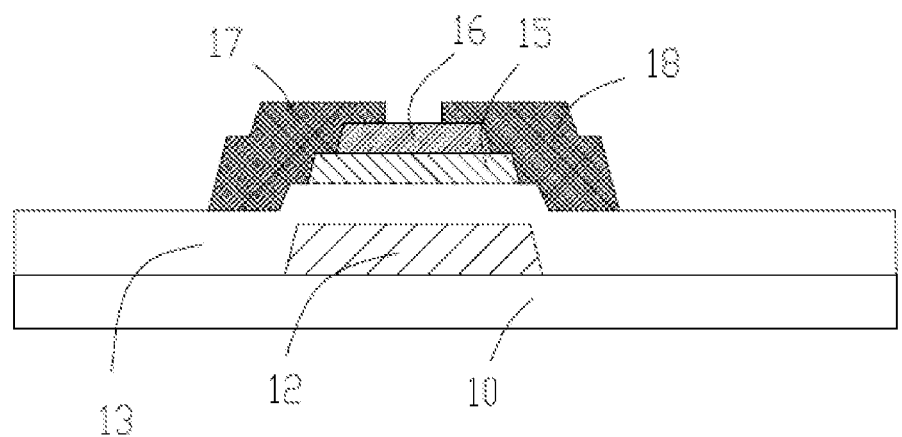

Referring to FIG. 6, Step S5 is forming a second metal layer on the thin-film transistor area and an exposed portion of the gate insulation layer 13 and patternizing the second metal layer to form a source 17 and a drain 18 of the thin-film transistor, wherein the source 17 and the drain 18 are both connected to the oxide semiconductor layer 15.

Specifically, the second metal layer is arranged to stack sequentially on the oxide semiconductor layer 15 and the gate insulation layer 13. Known pattern formation operations are applied to patternize the second metal layer to form the illustrated source 17 and drain 18. The second metal layer comprises a material selected from one of copper, tungsten, chromium, aluminum, and combinations thereof. The oxide semiconductor layer 15 is used to form a channel for conducting on or off between the source 17 and the drain 18 of the thin-film transistor 10.

Figure 7:
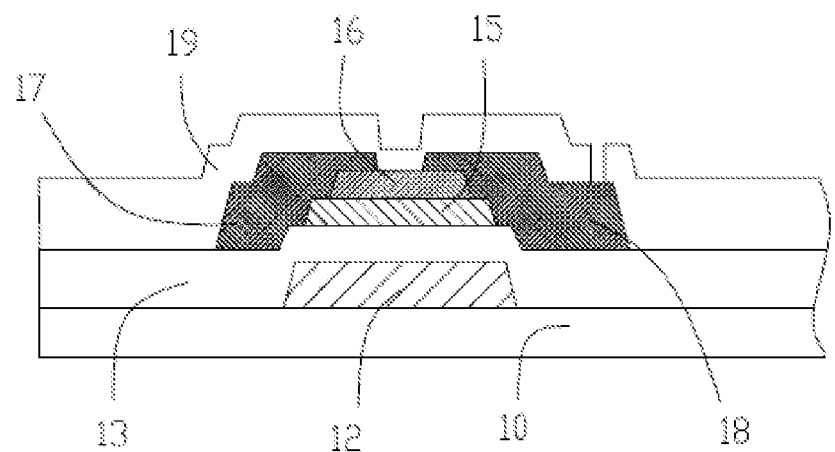

Referring to FIG. 7, Step S6 is forming an insulation protection layer 19 on the substrate 10 and the patternized second metal layer (the source 17 and the drain 18) and patternizing the insulation protection layer 19. The gate insulation layer 13 and the insulation protection layer 19 can be made of one of silicon oxide (SiOx), silicon nitride (SiNx), and silicon oxynitride (SiNxOy).

Figure 8:
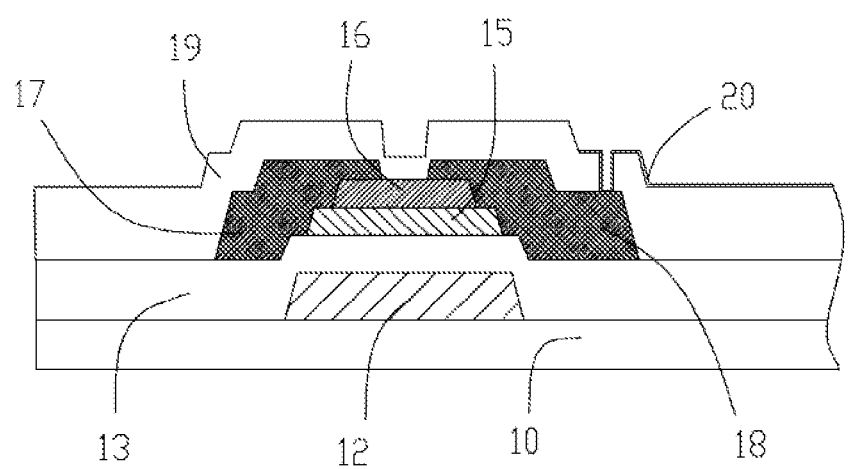

Referring to FIG. 8, Step S7 is forming a patternized pixel electrode 20 on the insulation protection layer 19 at a location, which after patternization is distant from the thin-film transistor area, in such a way that the pixel electrode 20 is connected to the drain 18.

In another embodiment of the present invention, a difference from the first embodiment is that the etch stop layer 16 is made of an inorganic insulation material and the etch stop layer is formed through a chemical vapor deposition based film formation process.

Step S43, which is the step of "applying two etching operations to the patternized oxide semiconductor layer 15 and etch stop layer 16", comprises applying a wet etching operation to the oxide semiconductor layer 15 and the etch stop layer 16 to form the oxide semiconductor layer and the etch stop layer that are of the same size and have orthogonal projections cast on the gate and then, applying a dry etching operation to an edge portion of the etch stop layer 16 so as to expose an edge portion of the oxide semiconductor layer 15.

In respect of the two embodiments described above, the present invention further provides manufacturing methods of the thin-film transistors. Before the specifics of the manufacturing methods have been described, it is noted here that in the present invention, patternization refers to pattern formation operations, which may comprise photolithographic operations or may alternatively comprise photolithographic operations and etching processes and also comprise other operations for forming predetermined patterns, including printing and ink jetting. Photolithography refers to operations for pattern formation by using photoresists, masks, and exposure machines and including film formation, exposure, and development operations. Pattern formation operations may be properly selected according to the structure to be formed in the present invention.

The present invention provides a method for manufacturing a thin-film transistor, which comprises performing one time patternization simultaneously on an oxide semiconductor layer 15 and an etch stop layer 16 and then performing two etching operations to respectively form the oxide semiconductor layer 15 and the etch stop layer 16 that are located exactly above a gate, whereby, compared to the prior art techniques, one time of pattern formation operation can be saved so as to simplify the processing operation of an oxide thin-film transistor and reduce the manufacturing cost of the thin-film transistor.

The displaying device formed with the method for manufacturing a thin-film transistor according the instant embodiment can be a liquid crystal panel, a liquid crystal television, a liquid crystal display, an OLED panel, an OLED television, an electronic paper, a digital picture frame, and a mobile phone.

The above illustrates only a preferred embodiment according to the present invention and is not intended to limit the scope of right of the present invention. Those having ordinary skills of the art would appreciate that various equivalent modifications that achieve all or some of the operations of the above-described embodiment and fall within scope of the attached claims are considered within the scope covered by the present invention.

What is claimed is:

1. A method for manufacturing a thin-film transistor, comprising:

providing a substrate;

forming a first metal layer on the substrate and applying pattern formation operation to form the first metal layer into a pattern including a gate;

forming a gate insulation layer on the substrate and the first metal layer in such a way that the gate insulation layer covers a surface of the substrate and the first metal layer;

forming an oxide semiconductor layer, of which an orthogonal projection is cast on the gate, on the gate insulation layer within a thin-film transistor area and an etch stop layer on the oxide semiconductor layer, wherein the oxide semiconductor layer has an edge portion that is exposed outside the etch stop layer, comprising the following sub-steps:

coating an oxide semiconductor coating layer and an etch stop coating layer on the gate insulation layer of the substrate in such a way that the etch stop coating layer is stacked on the oxide semiconductor coating layer; applying pattern formation operations to simultaneously patternize the oxide semiconductor coating layer and the etch stop coating layer so as to form a patternized oxide semiconductor layer and a patternized etch stop layer on the thin-film transistor area of the substrate; and then, applying two etching operations, which includes a first etching operation and a second etching operation, to the patternized oxide semiconductor layer and etch stop layer such that the first etching operation etch the pattenized oxide semiconductor layer and the patternized etch stop layer to form the oxide semiconductor layer and the etch stop layer having the same size cast an identical projection on the gate;

forming a second metal layer on the thin-film transistor area and an exposed portion of the gate insulation layer and patternizing the second metal layer to form a source and a drain of the thin-film transistor, wherein the source and the drain are both connected to the oxide semiconductor layer;

forming an insulation protection layer on the substrate and the patternized second metal layer and patternizing the insulation protection layer; and forming a patternized pixel electrode on the insulation protection layer at a location, which after patternization is distant from the thin-film transistor area, in such a way that the pixel electrode is connected to the drain.

2. The method for manufacturing a thin-film transistor as claimed in claim 1, wherein the etch stop layer is made of a metal oxide material.

3. The method for manufacturing a thin-film transistor as claimed in claim 2, wherein the oxide semiconductor layer and the etch stop layer are formed through one time film formation operation.

4. The method for manufacturing a thin-film transistor as claimed in claim 3, wherein the etch stop layer is formed through a physical vapor deposition based film formation process.

5. The method for manufacturing a thin-film transistor as claimed in claim 4, wherein the step of "applying two etching operations to the patternized oxide semiconductor layer and etch stop layer" comprises: first applying a wet etching operation as the first etching operation to the patternized oxide semiconductor layer and the etch stop layer so as to form the oxide semiconductor layer and the etch stop layer that are of the same size and have an identical orthogonal projection cast on the gate, and then, applying a wet etching operation as the second etching operation to an edge portion of the etch stop layer so as to expose an edge portion of the oxide semiconductor layer.

6. The method for manufacturing a thin-film transistor as claimed in claim 1, wherein the etch stop layer is made of an inorganic insulation material.

7. The method for manufacturing a thin-film transistor as claimed in claim 6, wherein the etch stop layer is formed through a chemical vapor deposition based film formation process.

8. The method for manufacturing a thin-film transistor as claimed in claim 1, wherein the step of "applying two etching operations to the patternized oxide semiconductor layer and etch stop layer" comprises: first applying a wet etching operation as the first etching operation to the oxide semiconductor layer and the etch stop layer to form the oxide semiconductor layer and the etch stop layer that are of the same size and have an identical orthogonal projection cast on the gate, and then, applying a dry etching operation as the second etching operation to an edge portion of the etch stop layer 16 so as to expose an edge portion of the oxide semiconductor layer.

9. The method for manufacturing a thin-film transistor as claimed in claim 1, wherein the gate insulation layer and the insulation protection layer are made of one of silicon oxide (SiOx), silicon nitride (SiNx), and silicon oxynitride (SiNxOy).

10. The method for manufacturing a thin-film transistor as claimed in claim 1, wherein the oxide semiconductor layer comprises a material selected from one of zinc oxide (ZnO), indium zinc oxide (InZnO), zinc tin oxide (ZnSnO), gallium indium zinc oxide (GaInZnO), and zirconium indium zinc oxide (ZrInZnO).

* * * * *